US008610129B2

(12) United States Patent
Nam et al.

(10) Patent No.: US 8,610,129 B2
(45) Date of Patent: Dec. 17, 2013

(54) COMPOUND SEMICONDUCTOR IMAGE SENSOR

(75) Inventors: Jung-gyu Nam, Yongin-si (KR); Sang-cheol Park, Yongin-si (KR); Kyu-sik Kim, Yongin-si (KR); Young-jun Park, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 140 days.

(21) Appl. No.: 13/220,232

(22) Filed: Aug. 29, 2011

(65) Prior Publication Data

US 2012/0056192 A1 Mar. 8, 2012

Related U.S. Application Data

(63) Continuation of application No. 12/125,718, filed on May 22, 2008, now abandoned.

(30) Foreign Application Priority Data

Jan. 15, 2008 (KR) .................... 10-2008-0004436

(51) Int. Cl.
*H01L 31/0256* (2006.01)
(52) U.S. Cl.
USPC 257/76; 257/43; 257/E31.007; 257/E31.027; 438/57; 438/85; 438/95; 438/104
(58) Field of Classification Search
None
See application file for complete search history.

(56) References Cited

U.S. PATENT DOCUMENTS

| 4,867,801 | A | 9/1989 | Stanbery |
| 5,286,306 | A | 2/1994 | Menezes |
| 6,310,282 | B1 | 10/2001 | Sakurai et al. |
| 7,972,899 | B2 * | 7/2011 | Oladeji ................. 438/104 |
| 2005/0194653 | A1 | 9/2005 | Hynecek et al. |
| 2005/0205903 | A1 | 9/2005 | Hioki |
| 2011/0124150 | A1 * | 5/2011 | Girt et al. .............. 438/95 |

FOREIGN PATENT DOCUMENTS

| JP | 01055876 | 3/1989 |
| JP | 2004022897 A | 1/2004 |

OTHER PUBLICATIONS

DiGiuseppe et al. ("Preparation and Characterization of the System CuGa1-xFexS2," Inorganic Chemistry, vol. 13, No. 9, Jan. 10, 1974).*
Machine translation of Sakae et al. (JP 2004-022897).*

* cited by examiner

*Primary Examiner* — Yasser Abdelaziez
(74) *Attorney, Agent, or Firm* — Cantor Colburn LLP

(57) ABSTRACT

A stack-type image sensor using a compound semiconductor. The stack-type image sensor includes a stack of photoelectric conversion units which are sequentially arranged in a light incident direction and which absorb light in ascending order of a wavelength from shortest to longest.

9 Claims, 4 Drawing Sheets

COMPOUND SEMICONDUCTOR IMAGE SENSOR

This application is a continuation in part of U.S. patent application Ser. No. 12/125,718 filed on May 22, 2008, which claims priority to Korean Patent Application No. 10-2008-0004436, filed on Jan. 15, 2008, and all the benefits accruing therefrom under 35 U.S.C.§119, the contents of which are incorporated herein by reference in their entirety.

BACKGROUND OF THE INVENTION

1. Field of the Invention

The present invention relates to a compound semiconductor image sensor including photoelectric conversion units which are vertically stacked and which absorb light of different wavelengths.

2. Description of the Related Art

An image sensor using a photoelectric transducer which detects light and converts the light into an electrical signal includes plurality of unit pixels arranged in matrix on a semiconductor substrate. Each of the unit pixels includes a photodiode and transistors.

A conventional complimentary metal oxide semiconductor ("CMOS") image sensor includes a CMOS control element and a photodiode which receives and stores optical signals. The conventional CMOS image sensor may be manufactured on a single chip along with signal processing elements.

In the conventional CMOS image sensor, the photodiode includes a color filter which transmits light of a particular wavelength. Since the color filter absorbs approximately ⅔ of light incident on the photodiode, the amount of light input to the photodiode is reduced, which causes a reduction in the sensitivity of the conventional CMOS image sensor.

U.S. Patent Publication No. 2005/0194653, discloses an CMOS image sensor, which does not use a color filter. In this CMOS image sensor, vertically stacked photodiodes generate electrical signals.

Also, U.S. Patent Publication No. 2005/0205903 discloses a CMOS image sensor, which does not use a color filter. In this CMOS image sensor, a photoelectric conversion film is used as a photoelectric conversion unit.

BRIEF SUMMARY OF THE INVENTION

The present invention has made an effort to solve the above-stated problems and aspects of the present invention provide a vertically stacked image sensor using a compound semiconductor which can increase light use efficiency.

In an exemplary embodiment, the present invention provides an image sensor including a multi-layered I-III-VI-based photoelectric conversion unit which includes a first photoelectric conversion unit including a I-III-VI-based material layer which absorbs light of a first wavelength band, a second photoelectric conversion unit including a I-III-VI-based material layer which absorbs light of a second wavelength band longer than the first wavelength band, and a third photoelectric conversion unit including a I-III-VI-based material layer which absorbs light of a third wavelength band longer than the second wavelength band.

According to an exemplary embodiment, the first photoelectric conversion unit includes a $CuGaS_2$ layer, the second photoelectric conversion unit includes a $CuGa_{(1-x)}Fe_xS_2$ layer ($0.059 \leq x \leq 0.069$), and the third photoelectric conversion unit includes a $CuGa_{(1-y)}Fe_yS_2$ layer ($0.123 \leq y \leq 0.133$).

According to an exemplary embodiment, the first photoelectric conversion unit includes a bandwidth of 2.75($\pm$0.05) eV, the second photoelectric conversion unit includes a bandwidth of 2.25($\pm$0.05) eV, and the third photoelectric conversion unit includes a bandwidth of 1.90($\pm$0.05) eV.

BRIEF DESCRIPTION OF THE DRAWINGS

The above and other aspects, features and advantages of the present invention will become apparent from the following detailed description when taken in conjunction with the accompanying drawings, in which.

DETAILED DESCRIPTION OF THE INVENTION

Figure 1:
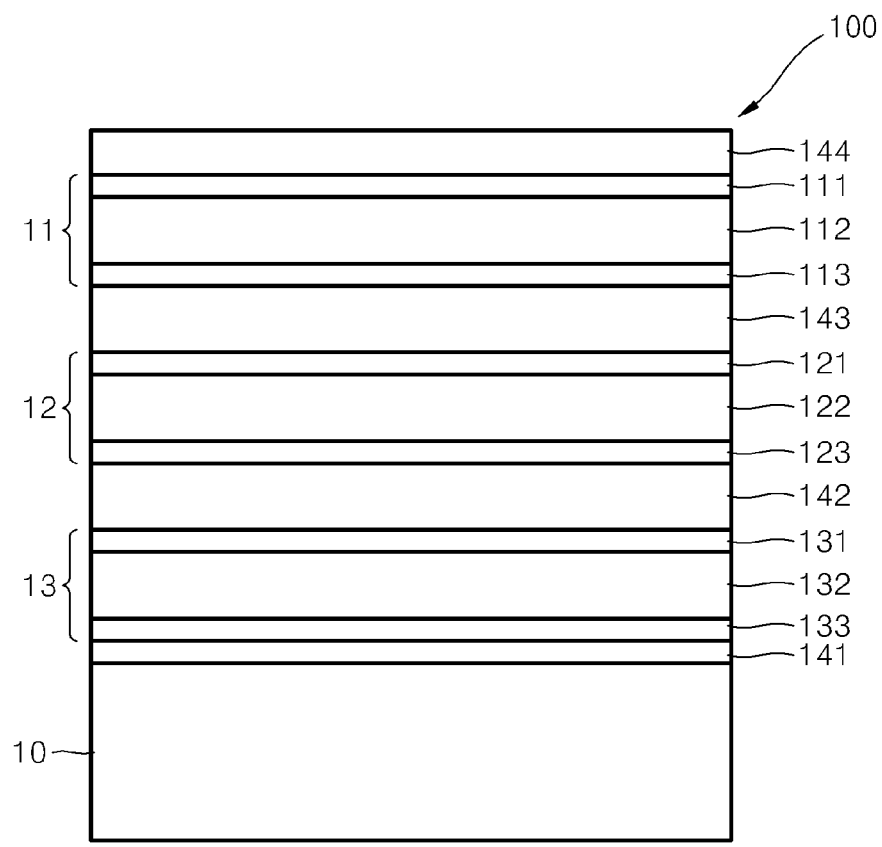
FIG. 1 is a cross-sectional view of an exemplary embodiment of an image sensor according to the present invention.

The invention is described more fully hereinafter with reference to the accompanying drawings, in which exemplary embodiments of the invention are shown. The present invention may, however, be embodied in many different forms and should not be construed as being limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinafter, exemplary embodiments of the present invention will be described in detail with reference to the accompanying drawings.

Figure 2:
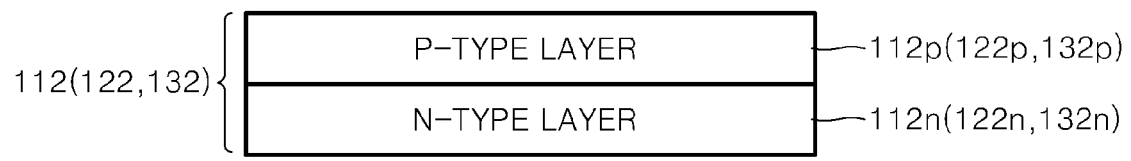
FIG. 2 is a cross-sectional view illustrating an exemplary embodiment of a light absorbing layer of the image sensor of FIG. 1 according to the present invention.

FIG. 1 is a cross-sectional view of an image sensor 100 using a I-III-VI-based compound semiconductor according to an exemplary embodiment of the present invention. FIG. 2 is a cross-sectional view illustrating a light absorbing layer of each of vertically stacked first through third photoelectric conversion units 11, 12, and 13 according to an exemplary embodiment of the present invention.

Referring to FIG. 1, the first photoelectric conversion unit 11, the second photoelectric conversion unit 12, and the third photoelectric conversion unit 13 are vertically and sequentially stacked on a substrate 10. Each of the first, second and third photoelectric conversion units 11, 12, 13 includes a PN junction diode structure and is electrically isolated.

A P-type layer of each of the first, second and third photoelectric conversion units 11, 12, 13 includes a I-III-VI-based material. According to an exemplary embodiment, The first, second and third photoelectric conversion units 11, 12, 13 have different band gaps and are sequentially arranged in a light incident direction to absorb light in ascending order of wavelength. That is, from the shortest wavelength to the longest wavelength. Accordingly, the first, second and third photoelectric conversion units 11, 12, 13 perform photoelectric conversion on light of different wavelengths. The first, second and third photoelectric conversion units 11, 12, 13 are sequentially arranged in a light incident direction. The first photoelectric conversion unit 11, which is an uppermost layer, absorbs light with a shorter wavelength than that of light absorbed by the second and third photoelectric conversion units 12 and 13. Light with an intermediate wavelength which is not absorbed by the first photoelectric conversion unit 11 passes through and is partially absorbed by the second photoelectric conversion unit 12. Light with a long wavelength which is not absorbed by the first and second photoelectric conversion units 11 and 12 is incident on and absorbed by the third photoelectric conversion unit 13 which is a lowermost layer.

According to an exemplary embodiment, when the wavelengths absorbed by the first, second and third photoelectric conversion units 11, 12, 13 span an entire visible spectrum, the first photoelectric conversion unit 11 absorbs blue light of a short wavelength region, the second photoelectric conversion unit 12 absorbs green light of an intermediate wavelength, and the third photoelectric conversion unit 13 absorbs red light of a long wavelength, for example. In the current exemplary embodiment, the first, second and third photoelectric conversion units 11, 12, 13 can perform photoelectric conversion on light of three different wavelengths. Accordingly, when the image sensor is arrayed at an X-Y matrix as in conventional image sensors, a color image can be captured as an electrical signal.

The first, second and third photoelectric conversion units 11, 12,13 respectively include light absorbing layers 112, 122, and 132 of a given wavelength bands. As shown in FIG. 2, the light absorbing layers 112, 122, and 132 of the first, second and third photoelectric conversion units 11, 12, and 13 respectively include P-type layers 112$p$, 122$p$, and 132$p$, and N-type layers 112$n$, 122$n$, and 132$n$. Each of the P-type layers 112$p$, 122$p$, and 132$p$ is formed of a I-III-VI-based material, and each of the N-type layers is formed of CdS or ZnS. The P-type layers 112$p$, 122$p$, and 132$p$ and the N-type layers 112$n$, 122$n$, and 132$n$ form a hetero junction with each other.

According to an exemplary embodiment, the first photoelectric conversion unit 11$y$ absorbs light, e.g., blue light, with a short wavelength, the second photoelectric conversion unit 12 absorb light, e.g., green light, with an intermediate wavelength longer than the short wavelength of the blue light, and the third photoelectric conversion unit 13 absorbs light, e.g., red light, with a long wavelength longer than the intermediate wavelength of the green light.

Further, according to an exemplary embodiment, the P-type layer 112$p$ of the first photoelectric conversion unit 11 is formed of $CuGaS_2$, the P-type layer 122$p$ of the second photoelectric conversion unit 12 is formed of $CuGa_{(1-x)}Fe_xS_2$ ($0.059 \leq x \leq 0.069$), and the P-type layer 132$p$ of the third photoelectric conversion unit 13 is formed of $CuGa_{(1-y)}Fe_yS_2$ ($0.123 \leq y \leq 0.133$).

In terms of band gaps, the first photoelectric conversion unit 11 includes a bandwidth of 2.75($\pm$0.05) eV, the second photoelectric conversion unit 12 includes a bandwidth of 2.25($\pm$0.05) eV, and the third photoelectric conversion unit 13 includes a bandwidth of 1.90($\pm$0.05) eV.

Transparent first and second electrode pairs 111 and 113, 121 and 123, and 131 and 133 which are formed of indium zinc oxide (IZO) or indium tin oxide (ITO) are disposed on both sides of the light absorbing layers 112, 122, and 132 of the first, second and third photoelectric conversion units 11, 12, and 13, respectively. Insulating layers 144, 143, 142, and 141 are disposed on the first photoelectric conversion unit 11, between the first and second photoelectric conversion units 11 and 12, between the second and third photoelectric conversion units 12 and 13, and between the third photoelectric conversion unit 13 and the substrate 10, respectively.

As described above, the color image sensor includes the vertically stacked first, second and third photoelectric conversion units 11, 12, 13. A CMOS circuit unit is disposed under the vertically stacked first, second and third photoelectric conversion units 11, 12, 13, and adapted to receive charges from the first, second and third photoelectric conversion units 11, 12, 13 and output current. The CMOS circuit unit is formed on a surface of the substrate 10.

Figure 3:
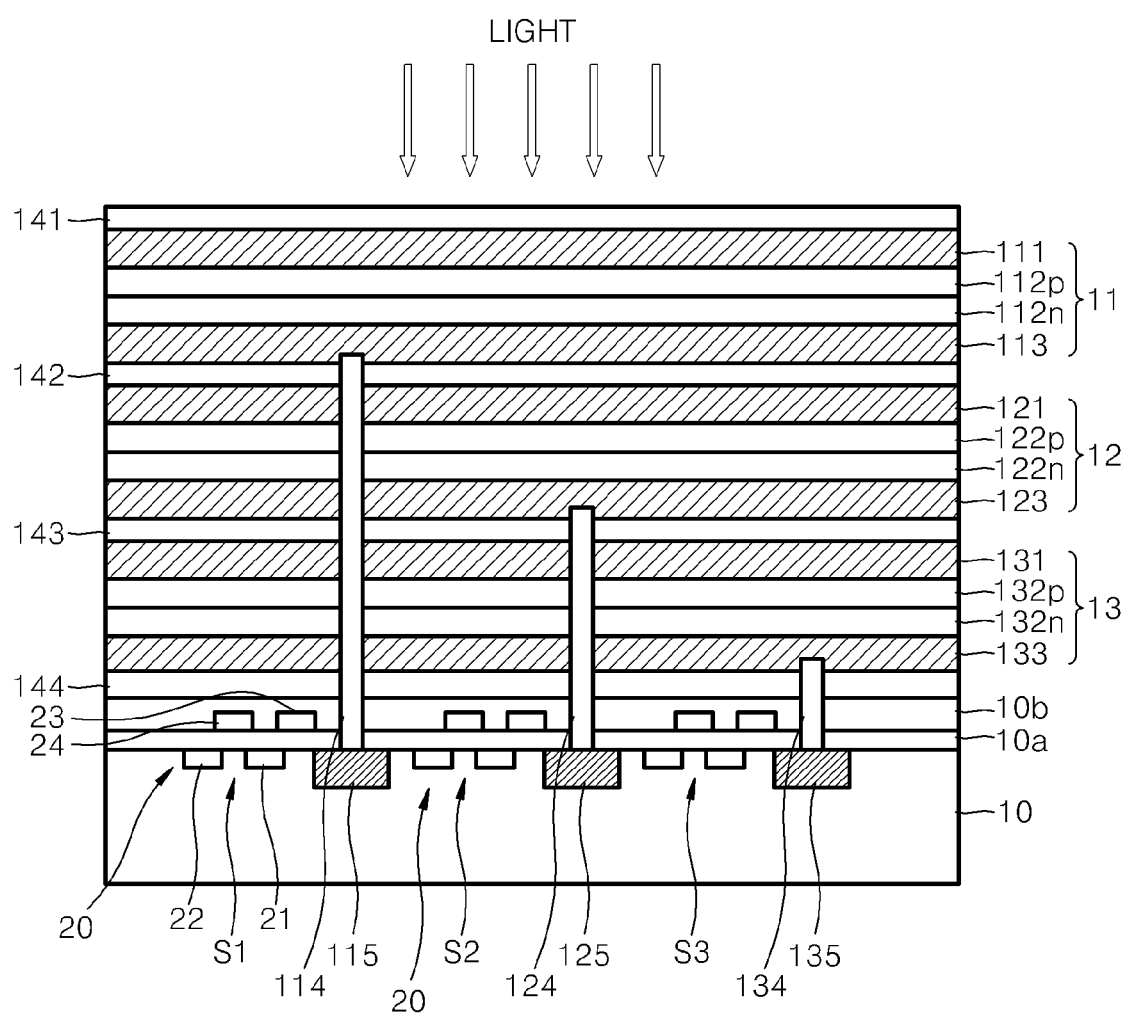
FIG. 3 is a cross-sectional view of another exemplary embodiment of an image sensor according to the present invention.

FIG. 3 is a cross-sectional view of another exemplary embodiment of an image sensor according to the present invention. Referring to FIG. 3, a CMOS circuit unit 20 is disposed in a substrate 10, e.g., a p-type silicon substrate. The CMOS circuit unit 20 includes first, second and third signal processing regions S1, S2, S3 formed on the substrate 10.

The signal processing regions S1, S2, S3 respectively include doped regions 115, 125, and 135 connected through wiring layers 114, 124, and 134 to second electrodes 113, 123, and 133 of first, second and third photoelectric conversion units 11, 12, 13, floating diffusion regions 21, and reset regions 22. According to an exemplary embodiment, the doped regions 115, 125, and 135, the floating diffusion regions 21, and the reset regions 22 may be n+-type doped regions.

Insulating layers 10a and 10b are formed on the substrate 10, and a transfer gate 23 and a reset gate 24 corresponding to each of the first, second and third photoelectric conversion units 11, 12, 13 are disposed between the insulating layers 10a and 10b.

The reset gate 24 between the insulating layers 10a and 10b is disposed between the floating diffusion region 21 and the reset region 22 and constitutes a reset transistor. According to an exemplary embodiment, a drive transistor and a selection transistor may be further disposed as signal processing control elements on a side of each of the doped regions 115, 125, and 135.

The wiring layers 114, 124, and 134 electrically connect the second electrodes 113, 123, and 133 of the first, second and third photoelectric conversion units 11, 12, 13 to the doped regions 115, 125, and 135, respectively. Each of the wiring layers 114, 124, and 134 is electrically isolated from other elements in a via hole. For example, an electrical short circuit with the other elements may be prevented due to an insulating spacer formed on an inner wall of the via hole.

Figure 4:
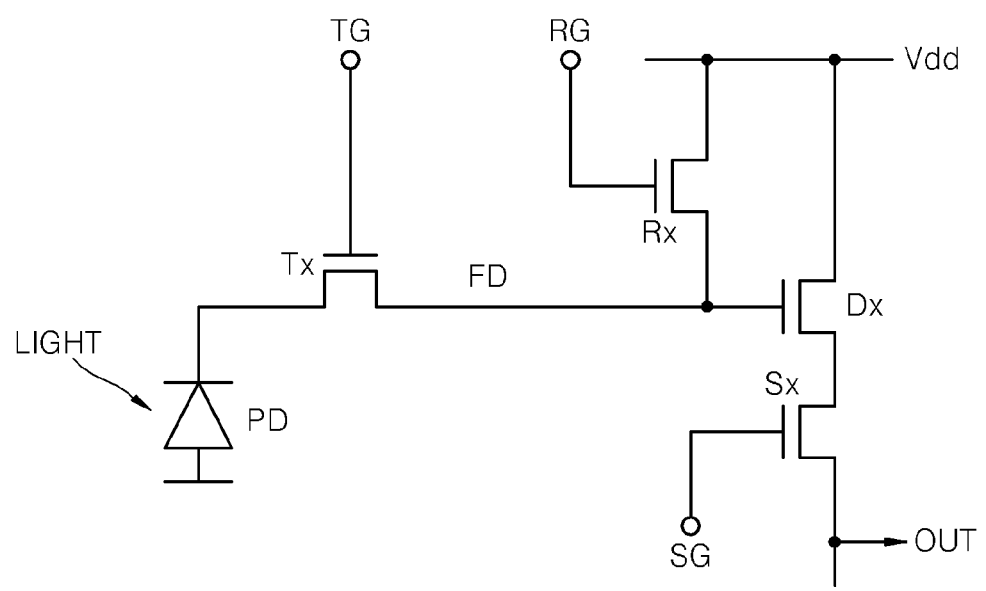
FIG. 4 is an equivalent circuit diagram of an exemplary embodiment of a unit pixel of an image sensor according to the present invention.

FIG. 4 is an equivalent circuit diagram of an exemplary embodiment of a pixel of a CMOS circuit unit. Referring to FIG. 4, the pixel of the CMOS circuit unit includes a photodiode PD acting as a photoelectric conversion unit, a transfer transistor Tx, a reset transistor Rx, a drive transistor Dx, and a selection transistor Sx.

When light is incident on the photodiode PD in a state where a direct current ("DC") voltage is applied to the photodiode PD, electrons are generated by the photodiode PD. The transfer transistor Tx controls the transmission of the electrons generated by the photodiode PD to a floating diffusion region FD by using a transfer gate line signal TG. The reset transistor Rx resets a voltage of the floating diffusion region FD by controlling input power Vdd by using a reset gate line signal RG. The drive transistor Dx is a source follower amplifier. The selection transistor Sx is a switching element which selects a unit pixel by using a selection gate line signal SG. The input power source Vdd passes through the drive transistor Dx and the selection transistor Sx and is output via an output line OUT.

Such photoelectric conversion is performed by vertically stacked photoelectric conversion units absorbing light of different wavelengths. Accordingly, an electrical signal can be obtained from given color light without using a color filter. Since the photoelectric conversion units 11, 12 and 13 are vertically stacked, a higher density unit pixel can be formed, thereby allowing the image sensor with higher resolution when compared with a conventional image sensor in which photoelectric conversion units are horizontally disposed on a substrate.

Figure 5:
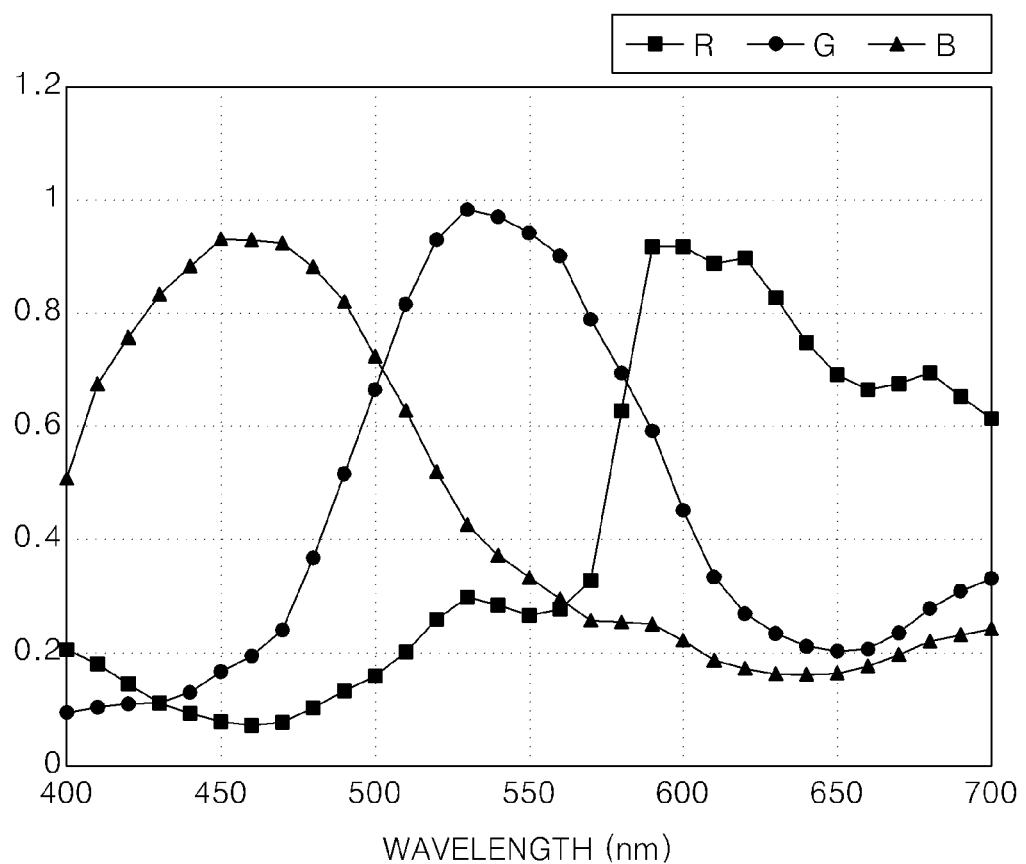
FIG. 5 is a simulation graph illustrating an exemplary embodiment of light absorbing characteristics of photoelectric conversion units of an image sensor according to the present invention.

FIG. 5 is a simulation graph illustrating an exemplary embodiment of light absorbing characteristics of a vertical stack of photoelectric conversion units of an image sensor according to the present invention.

In the simulation, P-type layers of photoelectric conversion units absorbing blue light, green light, and red light were formed of $CuGaS_2$, $CuGa_{(1-x)}Fe_xS_2$ ($0.059 \leq x \leq 0.069$), and $CuGa_{(1-y)}Fe_yS_2$ ($0.123 \leq y \leq 0.133$), respectively. In one embodiment, x is greater than or equal to about 0.059 and less than or equal to about 0.069. In another embodiment, y is greater than or equal to about 0.123 and less than or equal to about 0.133. N-type layers of the photoelectric conversion units were formed of CdS. The materials of the photoelectric conversion units were controlled to have specific band gaps. The P-type layer of the photoelectric conversion unit absorbing the blue light was controlled to have a bandwidth of 2.75($\pm$0.05) eV, the P-type layer of the photoelectric conversion unit absorbing the green light was controlled to have a bandwidth of 2.25($\pm$0.05) eV, and the P-type layer of the photoelectric conversion unit absorbing the red light was controlled to have a bandwidth of 1.90($\pm$0.05) eV. Since the I-III-VI-based materials used in the image sensor according to an exemplary embodiment of the present invention have a higher light absorption than Si-based materials which are used in the conventional image sensor, the image sensor can have higher sensitivity than the conventional image sensor.

While the present invention has been shown and described with reference to some exemplary embodiments thereof, it should be understood by those of ordinary skill in the art that various changes in form and details may be made therein without departing from the spirit and scope of the present invention as defined by the appending claims.

What is claimed is:

1. An image sensor comprising:
   a multi-layered I-III-VI-based photoelectric conversion unit which absorbs light of wavelength bands in steps; and
   a substrate which supports the multi-layered I-III-VI-based photoelectric conversion unit,
   wherein the multi-layered I-III-VI-based photoelectric conversion unit comprises:
   a first photoelectric conversion unit including a I-III-VI-based material layer which absorbs light of a first wavelength band;
   a second photoelectric conversion unit including a I-III-VI-based material layer which absorbs light of a second wavelength band longer than the first wavelength band; and
   a third photoelectric conversion unit including a I-III-VI-based material layer which absorbs light of a third wavelength band longer than the second wavelength band, and
   wherein the first photoelectric conversion unit includes a $CuGaS_2$ layer, the second photoelectric conversion unit includes a $CuGa_{(1-x)}Fe_xS_2$ layer ($0.059 \leq x \leq 0.069$), and the third photoelectric conversion unit includes a $CuGa_{(1-y)}Fe_yS_2$ layer ($0.123 \leq y \leq 0.133$).

2. The image sensor of claim 1, further comprising an insulating layer disposed between the first and second conversion units and between the second and third photoelectric conversion units.

3. The image sensor of claim 1, further comprising a complementary metal oxide semiconductor circuit unit disposed on the substrate and electrically connected to the photoelectric conversion unit.

4. The image sensor of claim 1, wherein the first photoelectric conversion unit comprises a bandwidth of 2.75($\pm$0.05) eV, the second photoelectric conversion unit comprises a bandwidth of 2.25(±0.05) eV, and the third photoelectric conversion unit comprises a bandwidth of 1.90 (±0.05) eV.

5. The image sensor of claim 1, wherein each of the first, second and third photoelectric conversion units further comprises a CdS layer or a ZnS layer.

6. The image sensor of claim 3, wherein each of the first, second and third photoelectric conversion units further comprises a CdS layer or a ZnS layer.

7. The image sensor of claim 4, wherein each of the first, second and third photoelectric conversion units further comprises a CdS layer or a ZnS layer.

8. The image sensor of claim 1, wherein each of the first, second and third photoelectric conversion units comprises transparent first and second electrodes.

9. The image sensor of claim 4, wherein each of the first, second and third photoelectric conversion units comprises transparent first and second electrodes.

* * * * *